(12) United States Patent
Bronn et al.

(10) Patent No.: US 11,551,125 B2
(45) Date of Patent: Jan. 10, 2023

(54) HIGH DENSITY MICROWAVE HERMETIC INTERCONNECTS FOR QUANTUM APPLICATIONS

(71) Applicant: INTERNATIONAL BUSINESS MACHINES CORPORATION, Armonk, NY (US)

(72) Inventors: Nicholas T. Bronn, Long Island City, NY (US); Patryk Gumann, Tarrytown, NY (US); Sean Hart, Tarrytown, NY (US); Salvatore B. Olivadese, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 963 days.

(21) Appl. No.: 16/281,657

(22) Filed: Feb. 21, 2019

(65) Prior Publication Data

US 2020/0272927 A1    Aug. 27, 2020

(51) Int. Cl.
*G06N 10/00* (2022.01)
*H01P 3/06* (2006.01)
*H01P 5/08* (2006.01)

(52) U.S. Cl.
CPC ............. *G06N 10/00* (2019.01); *H01P 3/06* (2013.01); *H01P 5/085* (2013.01)

(58) Field of Classification Search
CPC ........... G06N 10/00; H01P 3/06; H01P 5/085; H01L 39/045
See application file for complete search history.

(56) References Cited

U.S. PATENT DOCUMENTS 6,758,059 B2    7/2004   Kelly et al.
8,279,022 B2   10/2012   Thom et al.
(Continued)

FOREIGN PATENT DOCUMENTS

EP          1474822 B1    12/2016
WO      02/073100 A1     9/2002
(Continued)

OTHER PUBLICATIONS

Nov. 9, 2018, U.S. Appl. No. 16/186,157.
(Continued)

*Primary Examiner* — Dzung D Tran
(74) *Attorney, Agent, or Firm* — Amin, Turocy & Watson, LLP (57) ABSTRACT

A quantum computer includes a refrigeration system under vacuum including a containment vessel, a qubit chip contained within a refrigerated vacuum environment defined by the containment vessel. The quantum computer further includes a plurality of interior electromagnetic waveguides and a plurality of exterior electromagnetic waveguides. The quantum computer further includes a hermetic connector assembly operatively connecting the interior electromagnetic waveguides to the exterior electromagnetic waveguides while maintaining the refrigerated vacuum environment. The hermetic connector assembly includes an exterior multi-waveguide connector, an interior multi-waveguide connector, and a dielectric plate arranged between and hermetically sealed with the exterior multi-waveguide connector and the interior multi-waveguide connector. The dielectric plate permits electromagnetic energy when carried by the interior and exterior pluralities of electromagnetic waveguides to pass therethrough.

20 Claims, 10 Drawing Sheets

(56) References Cited

U.S. PATENT DOCUMENTS

| | | | |
|---|---|---|---|
| 8,441,329 | B2 | 5/2013 | Thom et al. |
| 8,464,542 | B2 | 6/2013 | Hilton et al. |
| 9,134,047 | B2 * | 9/2015 | Black ............... H01L 39/02 |
| 9,350,460 | B2 | 5/2016 | Paik |
| 9,971,970 | B1 | 5/2018 | Rigetti et al. |
| 10,043,136 | B1 | 8/2018 | Abdo |
| 10,049,788 | B1 | 8/2018 | Maturo et al. |
| 10,068,181 | B1 | 9/2018 | Rigetti et al. |
| 10,319,896 | B2 | 6/2019 | Falcon et al. |
| 10,565,515 | B2 | 2/2020 | Lampert et al. |
| 10,586,909 | B2 | 3/2020 | Das et al. |
| 2010/0221960 | A1 | 9/2010 | Chung |
| 2014/0137571 | A1 | 5/2014 | Petroff et al. |
| 2016/0292587 | A1 | 10/2016 | Rigetti et al. |
| 2017/0177534 | A1 * | 6/2017 | Mohseni ............... H01L 39/223 |
| 2017/0222116 | A1 | 8/2017 | Abdo |
| 2017/0237144 | A1 | 8/2017 | Tobar et al. |
| 2017/0373658 | A1 | 12/2017 | Thom et al. |
| 2018/0102470 | A1 | 4/2018 | Das et al. |
| 2018/0113373 | A1 | 4/2018 | Witmer et al. |
| 2020/0119251 | A1 * | 4/2020 | Yohannes ............... H01L 24/05 |

FOREIGN PATENT DOCUMENTS

| | | |
|---|---|---|
| WO | 2005093649 A1 | 10/2005 |
| WO | 2016036078 A1 | 3/2016 |
| WO | 2017111949 A1 | 6/2017 |

OTHER PUBLICATIONS

Johannes Fink, "Microwave Quantum States Beat the Heat", Institute of Science and Technology (IST) Austria, Am Campus 1, 3400 Klosterneuburg, Austria, Mar. 27, 2017• Physics 10, 32. https://physics.aps.org/articles/v10/32.

R.E. George et al., "Multiplexing Superconducting Qubit Circuit for Single Microwave Photon Generation", J Low Temp Phys (2017) 189:60-75.

G. Batey et al., "A rapid sample-exchange mechanism for cryogen-free dilution refrigerators compatible with multiple high-frequency signal connections", Cryogenics 60 (2014) 24-32.

E.L. Holzman et al., "An hermetic coplanar waveguide-to-HDI microstrip microwave feedthrough"Microwave Symposium Digest 1998 IEEE MTT-S International, vol. 1, pp. 103-106.

J.M. Hornobrook J.M. et al., "Cryogenic Control Architecture for Large-Scale Quantum Computing", ARXIV.org, Cornell University Library, Sep. 8, 2014, pp. 1-8.

PCT/EP2020/053802 International Search Report dated May 26, 2020.

PCT/EP2020/053802 Written Opinion dated May 26, 2020.

Sejas-Garcia et al., Impact of the Configuration of Ground Vias on the Performance of Vertical Transitions Used in Electronic Packages, 2009 IEEE MTT-S International Microwave Workshop Series on Signal Integrity and High-Speed nterconnects (I MWS2009-R9), Feb. 19, 2009, pp. 17-20.

Das et al., Cryogenic Qubit Integration for Quantum Computing, 2018 IEEE 68th Electronic Components and Technology Conference, May 29, 2018, pp. 504-514.

International Search Report and Written Opinion for International Application No. PCT/EP2019/079643, dated Jan. 15, 2020.

Office Action for U.S. Appl. No. 16/186,157 dated Mar. 27, 2020.

* cited by examiner

HIGH DENSITY MICROWAVE HERMETIC INTERCONNECTS FOR QUANTUM APPLICATIONS

BACKGROUND

The present invention relates to hermetic interconnects for quantum applications, and more specifically, to high density microwave hermetic interconnects for quantum applications.

Universal quantum computers require large numbers of physical qubits. The qubits are often stored in a refrigeration system under vacuum to maintain coherence and to utilize the superconducting properties of materials at low temperatures. A large quantum computer is expected to include millions of qubits housed in a dilution fridge.

Error correction schemes require access to all qubits. Thus, each qubit must have a connection between the inside and outside of the dilution refrigerator. However, access to the vacuum environment inside the dilution refrigerator is limited by the number of connectors integrated into the plates that cover the access ports of the dilution refrigerator. Existing plates have a maximum of 200 microwave ports (superconducting qubits operate in the microwave range of electromagnetic radiation), limiting the number of qubits that can be included in a quantum computer to about 60. Further, each feedthrough connector on the plate requires an o-ring seal, introducing a possible point of failure with each connection.

SUMMARY

According to an embodiment of the present invention, a quantum computer includes a refrigeration system under vacuum including a containment vessel. The quantum computer further includes a qubit chip contained within a refrigerated vacuum environment defined by the containment vessel, wherein the qubit chip comprises a plurality of superconducting qubits each having a ground energy state and a first excited state at a higher energy than a corresponding ground state. The quantum computer further includes a plurality of interior electromagnetic waveguides arranged within the refrigerated vacuum environment so as to direct electromagnetic energy to and receive electromagnetic energy from at least a selected one of the plurality of superconducting qubits. The quantum computer further includes a plurality of exterior electromagnetic waveguides arranged exterior to the containment vessel so as to receive electromagnetic energy from and deliver electromagnetic energy to the plurality of interior electromagnetic waveguides.

According to an embodiment of the present invention, the quantum computer further includes a hermetic connector assembly operatively connecting the interior electromagnetic waveguides to the exterior electromagnetic waveguides while maintaining the refrigerated vacuum environment. The hermetic connector assembly includes an exterior multi-waveguide connector connected to the plurality of exterior electromagnetic waveguides, an interior multi-waveguide connector connected to the plurality of interior electromagnetic waveguides, and a dielectric plate arranged between and hermetically sealed with the exterior multi-waveguide connector and the interior multi-waveguide connector. The dielectric plate permits electromagnetic energy when carried by the interior and exterior pluralities of electromagnetic waveguides to pass therethrough.

According to an embodiment of the present invention, a hermetic connector assembly includes an exterior multi-waveguide connector configured to be connected to a plurality of exterior electromagnetic waveguides, and an interior multi-waveguide connector configured to be connected to a plurality of interior electromagnetic waveguides. The hermetic connector assembly further includes a dielectric plate arranged between and hermetically sealable with the exterior multi-waveguide connector and the interior multi-waveguide connector. The dielectric plate permits electromagnetic energy when carried by the interior and exterior pluralities of electromagnetic waveguides to pass therethrough.

The hermetic connector and hermetic connector assembly enable high-density connections between the qubit chip located within the refrigerated vacuum environment and the exterior of the containment vessel. This dramatically increases the number of qubits that can be accessed from outside the containment vessel, while still maintaining the qubits in an environment conducive to superconductivity.

DETAILED DESCRIPTION

Figure 1:
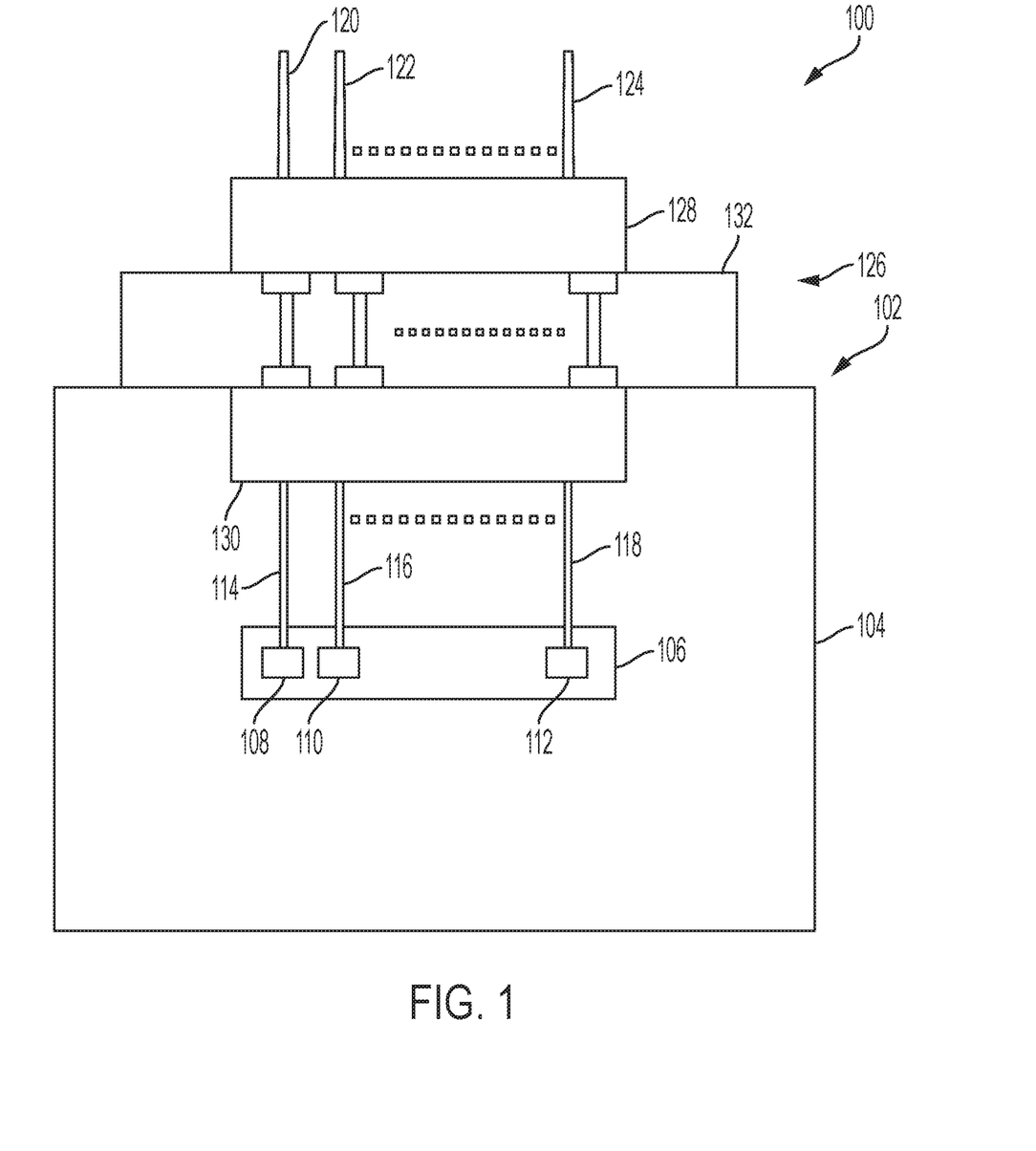
FIG. 1 is a schematic illustration of a quantum computer according to an embodiment of the invention.

FIG. 1 is a schematic illustration of a quantum computer 100 according to an embodiment of the invention. The quantum computer 100 includes a refrigeration system 102 under vacuum including a containment vessel 104. The quantum computer 100 also includes a qubit chip 106 contained within a refrigerated vacuum environment defined by the containment vessel 104. The qubit chip 106 includes a plurality of superconducting qubits 108, 110, 112 each having a ground energy state and a first excited state at a higher energy than a corresponding ground energy state. The quantum computer 100 includes a plurality of interior electromagnetic waveguides 114, 116, 118 arranged within the refrigerated vacuum environment so as to direct electromagnetic energy to and receive electromagnetic energy from at least a selected one of the plurality of superconducting qubits 108, 110, 112. The quantum computer 100 includes a plurality of exterior electromagnetic waveguides 120, 122, 124 arranged exterior to the containment vessel 104 so as to receive electromagnetic energy from and deliver electromagnetic energy to the plurality of interior electromagnetic waveguides 114, 116, 118. The quantum computer 100 includes a hermetic connector assembly 126 operatively connecting the interior electromagnetic waveguides 114, 116, 118 to the exterior electromagnetic waveguides 120, 122, 124 while maintaining the refrigerated vacuum environment. The hermetic connector assembly 126 includes an exterior multi-waveguide connector 128 connected to the plurality of exterior electromagnetic waveguides 120, 122, 124, and an interior multi-waveguide connector 130 connected to the plurality of interior electromagnetic waveguides 114, 116, 118. The hermetic connector assembly 126 also includes a dielectric plate 132 arranged between and hermetically sealed with the exterior multi-waveguide connector 128 and the interior multi-waveguide connector 130. The dielectric plate 132 permits electromagnetic energy when carried by the interior pluralities of electromagnetic waveguides 114, 116, 118 and exterior pluralities of electromagnetic waveguides 120, 122, 124 to pass therethrough.

The term "refrigerated vacuum environment" is intended to mean a suitable operating temperature and a suitable degree of a vacuum for the particular superconducting qubits being used. The refrigerated vacuum environment can be a pressure from ultra-high vacuum to $10^{-6}$ Torr range and a temperature less than 50 millikelvin, for example. However, the broad concepts of the current invention are not limited to this example. Superconducting qubit devices based on materials that become superconducting at higher temperatures and/or pressures could also be used.

The hermetic connector assembly 126 enables the quantum computer 100 to have high-density connections between the inside and outside of the refrigerated vacuum environment defined by the containment vessel 104. The dielectric plate 132 makes a hermetic vacuum seal while transferring microwave signals from one high-density connector at atmosphere, the exterior multi-waveguide connector 128, to one high-density connector at low pressure, the interior multi-waveguide connector 130.

Figure 2A:
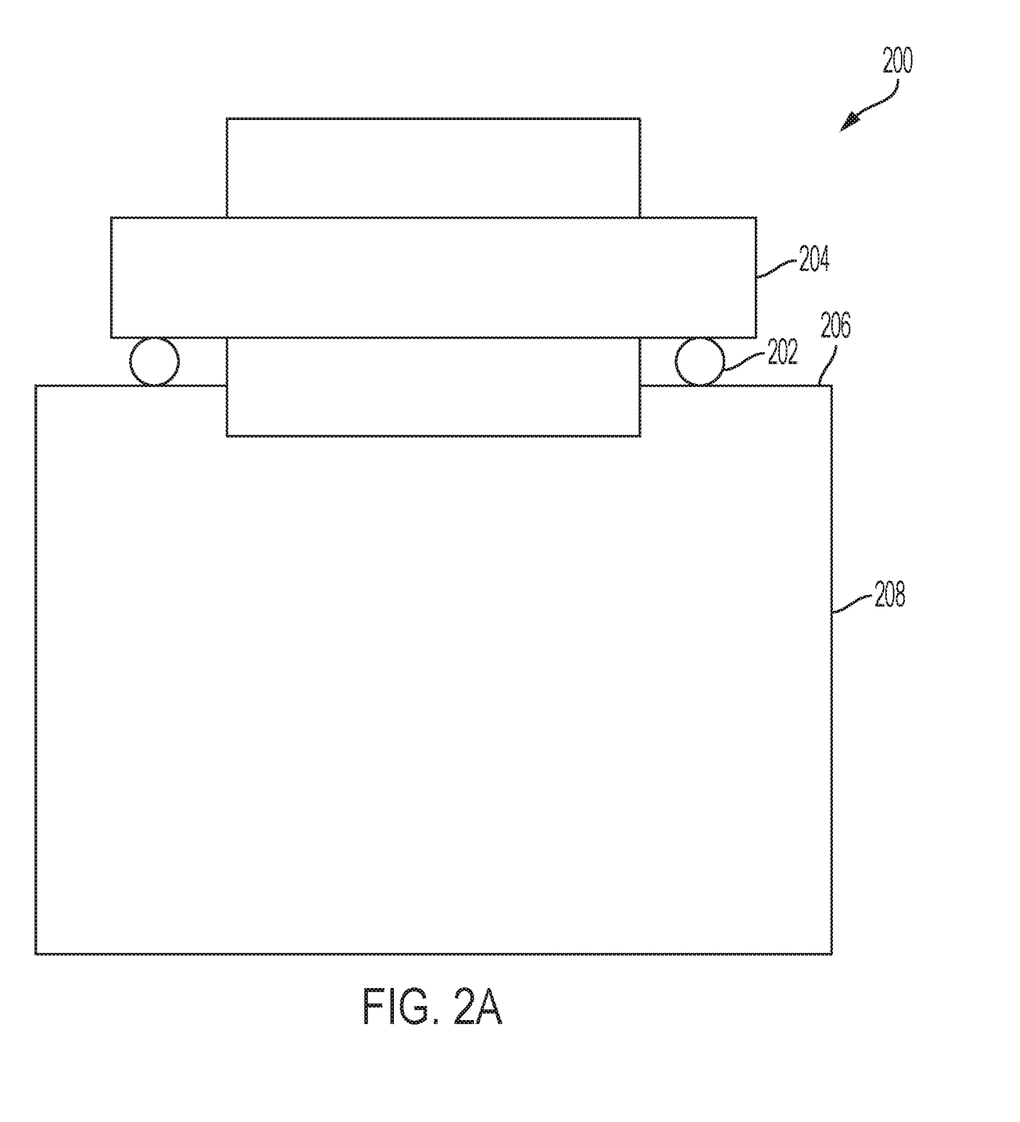
FIG. 2A is a schematic illustration of a hermetic connector assembly according to an embodiment of the invention.

FIG. 2A is a schematic illustration of a hermetic connector assembly 200 according to an embodiment of the invention. The hermetic connector assembly 200 includes an o-ring 202 arranged between the dielectric plate 204 and an outside surface 206 of the containment vessel 208 so as to maintain the refrigerated vacuum environment defined by the containment vessel 208. Embodiments of the invention are not limited to an o-ring. For example, other hermetic connections as conflat, indium seal, and certain epoxy materials may also be used to maintain the refrigerated vacuum environment.

Figure 2B:
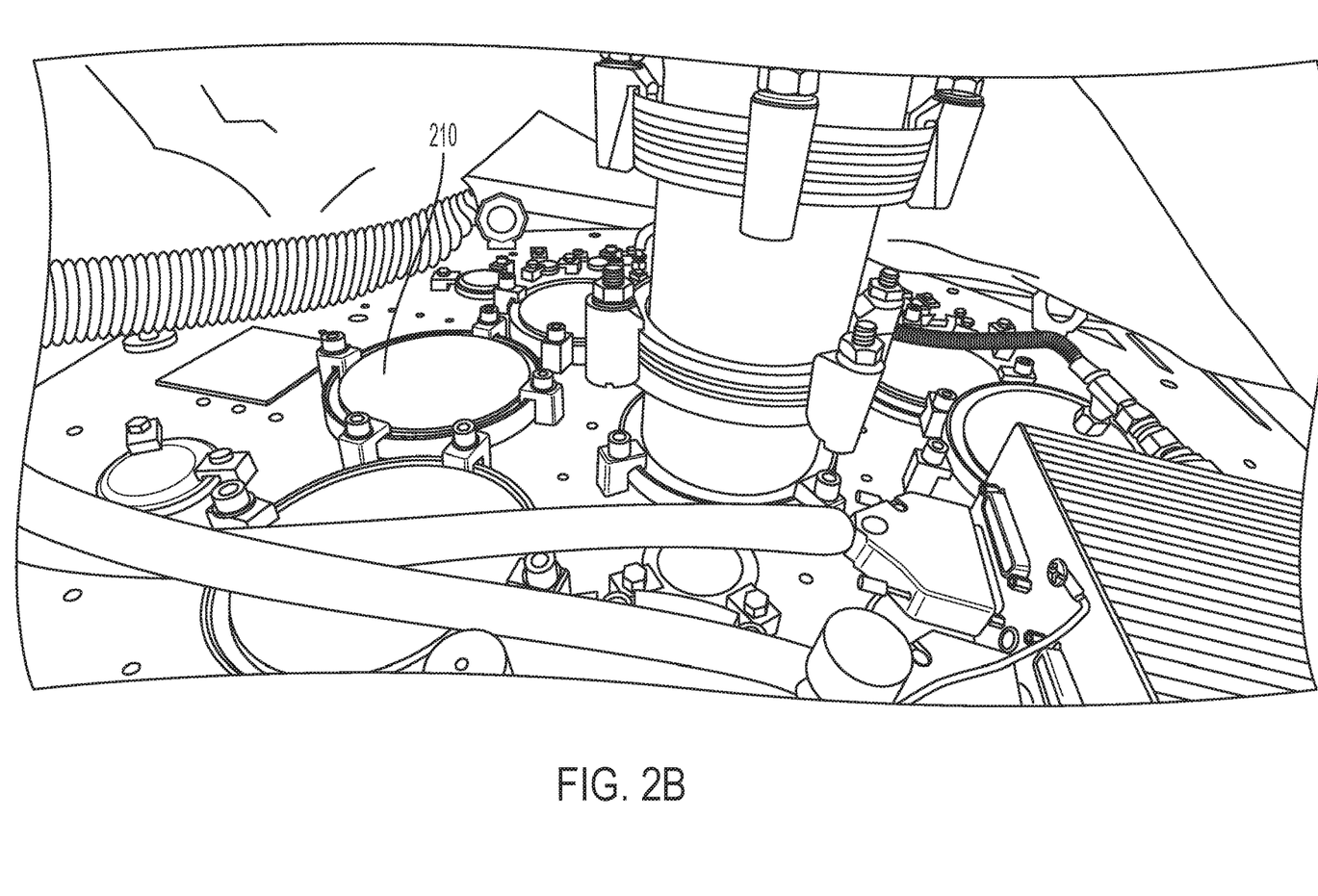
FIG. 2B is an image of the top of a dilution refrigerator.

FIG. 2B is an image of the top of a dilution refrigerator. The dilution refrigerator includes a plate 210 that covers an opening to the refrigerated vacuum environment defined by the dilution refrigerator. According to an embodiment of the invention, the hermetic connector assembly 126 fits into a hole in the plate 210.

Figure 3:
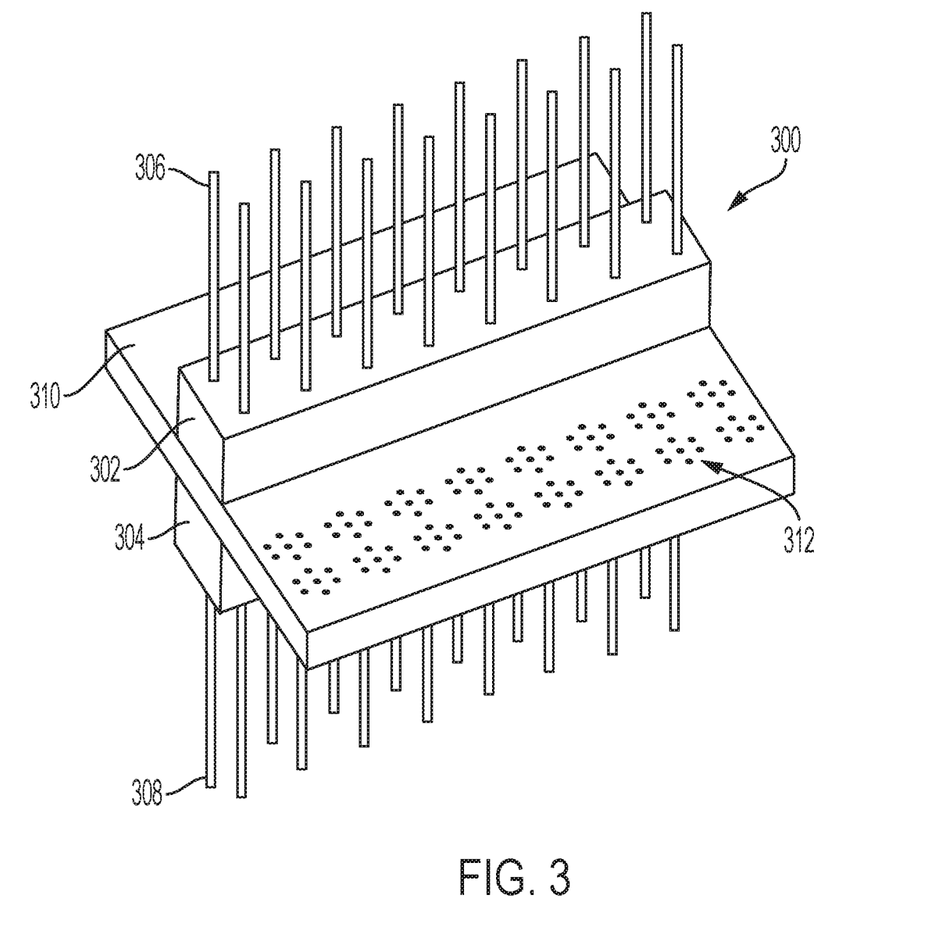
FIG. 3 is a schematic illustration of a hermetic connector assembly including an exterior multi-waveguide connector and an interior multi-waveguide connector.

FIG. 3 is a schematic illustration of a hermetic connector assembly 300 including an exterior multi-waveguide connector 302 and an interior multi-waveguide connector 304. The exterior multi-waveguide connector 302 connects to a plurality of exterior electromagnetic waveguides 306. The interior multi-waveguide connector 304 connects to a plurality of interior electromagnetic waveguides 308. The hermetic connector assembly 300 also includes a dielectric plate 310 arranged between the exterior multi-waveguide connector 302 and the interior multi-waveguide connector 304. The plurality of interior electromagnetic waveguides 308 direct electromagnetic energy to and receive electromagnetic energy from at least a selected one of a plurality of superconducting qubits formed on a qubit chip.

A qubit chip is a chip that includes a substrate and a structure that provides at least one quantum bit (qubit) formed thereon. In some embodiments, the qubit may be a superconducting qubit. The qubit may include one or more Josephson Junctions, for example. In some embodiments, the qubit may be a transmon. In some embodiments, the qubit chip includes superconducting wiring formed on the substrate. In some embodiments, the qubit chip includes a readout resonator or part of a readout resonator.

The frequency of the qubit corresponds to the transition energy between the two states of the qubit being used for computation. A qubit has two quantum states that are sufficiently separated in energy and/or decoupled from any additional quantum states so that the qubit is approximately a two-quantum state structure under operation conditions. The transition energy between the two states defines the frequency of the qubit.

According to an embodiment of the invention, the superconducting qubits 108, 110, 112 of the qubit chip 106 of the quantum computer 100 are a plurality of transmons. The transition between the ground and first excited state of each of the plurality of transmons is at microwave energies. The plurality of interior electromagnetic waveguides 114, 116, 118 and plurality of exterior electromagnetic waveguides 120, 122, 124 are microwave waveguides. According to an embodiment of the invention, the microwave waveguides are coaxial cables. According to some embodiments of the invention, the quantum computer 100 has an operating wavelength in the range of 1-20 GHz. The qubit frequency according to an embodiment is about 5 GHz, the readout frequency is about 7 GHz, and the frequency pump for quantum limited amplifiers is about 17 GHz, for example.

According to an embodiment of the invention, the plurality of interior electromagnetic waveguides 114, 116, 118 is greater than two hundred waveguides, and the plurality of exterior electromagnetic waveguides 120, 122, 124 is greater than two hundred waveguides. According to an embodiment of the invention, the plurality of interior electromagnetic waveguides 114, 116, 118 is greater than one thousand waveguides, and the plurality of exterior electromagnetic waveguides 120, 122, 124 is greater than one thousand waveguides. According to an embodiment of the invention, the plurality of interior electromagnetic waveguides 114, 116, 118 and the plurality of exterior electromagnetic waveguides 120, 122, 124 are equal in number and arranged in a one-to-one correspondence across the dielectric plate to provide waveguide channels.

According to an embodiment of the invention, the dielectric plate defines vias extending along a direction between each of said plurality of exterior electromagnetic waveguides and said plurality of interior electromagnetic waveguides in said one-to-one correspondence. FIG. 3 shows a dielectric pate 310 that includes a plurality of vias 312. In FIG. 3, some of the vias are mated to the signal lines of the exterior multi-waveguide connector 302 and signal lines of interior multi-waveguide connector 304, while some of the vias, such as the plurality of vias 312, are mated to ground. These can be mated to additional exterior and interior multi-waveguide connectors as needed.

Figure 4:
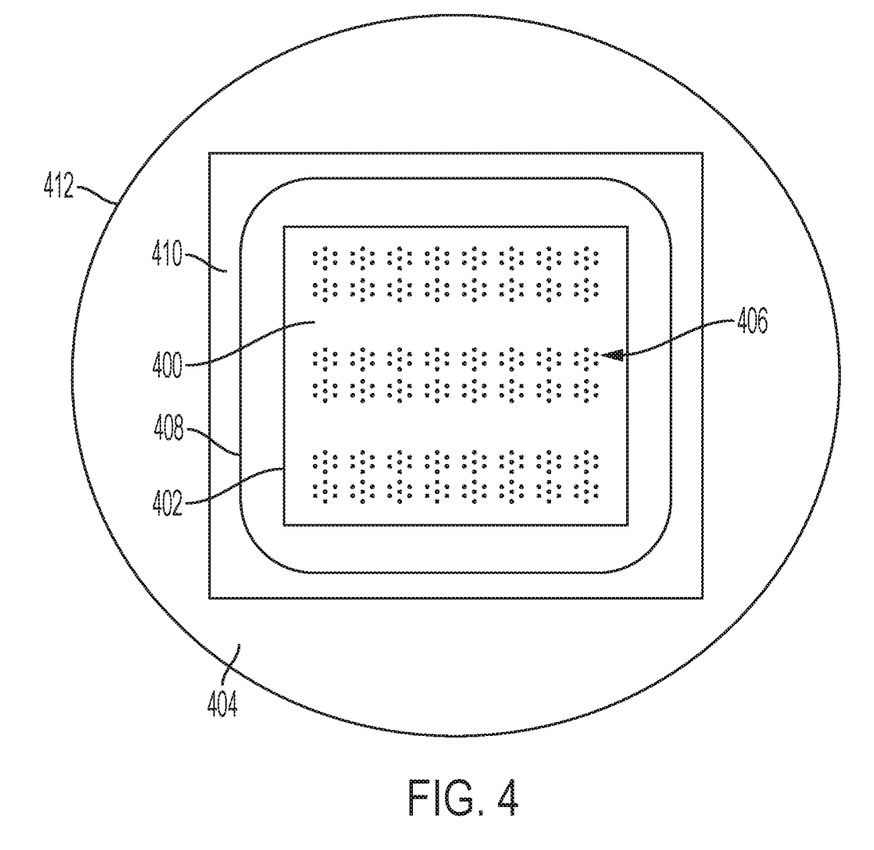
FIG. 4 is a schematic diagram of the underside of a dielectric plate according to an embodiment of the invention.

FIG. 4 is a schematic diagram of the underside of a dielectric plate 400 according to an embodiment of the invention. The dielectric plate 400 fits into a hole 402 in the plate 404 that covers the opening to the dilution refrigerator. The dielectric pate 400 includes vias 406 that carry signals through the dielectric plate. The vias 406 permit electromagnetic energy carried by the interior pluralities of electromagnetic waveguides and exterior pluralities of electromagnetic waveguides to pass therethrough. The square with curved edges is a hermetic seal 408 (such as an o-ring). According to an embodiment of the invention, the dielectric plate 400 extends beyond the hermetic seal 408 (for example, to the edges of the square 410). The circular feature 412 is a plate that also makes a hermetic seal with the dilution refrigerator, covering the access ports as in 210.

Figure 5:
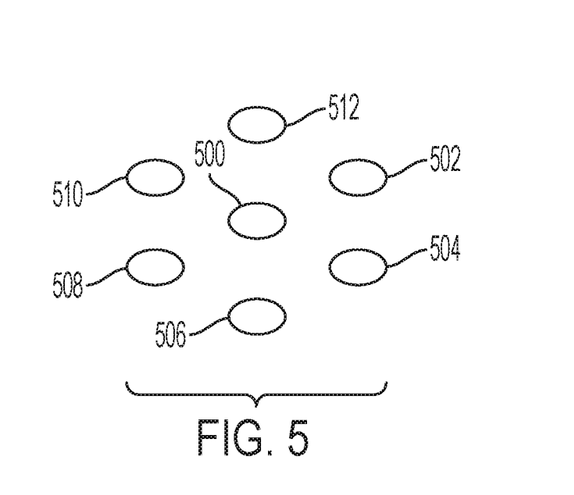
FIG. 5 is a schematic illustration of a plurality of vias according to an embodiment of the invention.

FIG. 5 is a schematic illustration of a plurality of vias according to an embodiment of the invention. A signal via 500 is surrounded by six ground vias 502-512. While FIG. 5 shows the signal via 500 being surrounded by ground vias 502-212 forming a hexagon, all embodiments of the invention are not limited to this configuration. The signal and ground vias may have any configuration that enables high-density connections through the dielectric plate. According to an embodiment of the invention, a 7 cm×7 cm hermetic plate has a sufficient number of vias to deliver 1000 lines. Assuming one input, one output, and one amplifier pump per qubit, this enables more than 300 superconducting qubits formed on one or more qubit chips housed inside the dilution refrigerator to be accessed from outside the dilution refrigerator.

According to an embodiment of the invention, the vias have a length less than $\lambda/10$, wherein $\lambda$ is a wavelength of electromagnetic waves carried by the plurality of interior and the plurality of exterior electromagnetic waveguides. This ensures the impedance of the transition (i.e., signal via) stays near 50 Ohms in order to minimize reflections and crosstalk. However, the relationship between the length of the vias and $\lambda$ could be different due to the difference in dielectric constant between exterior waveguides, hermetic dielectric, and interior waveguides.

Figure 6:
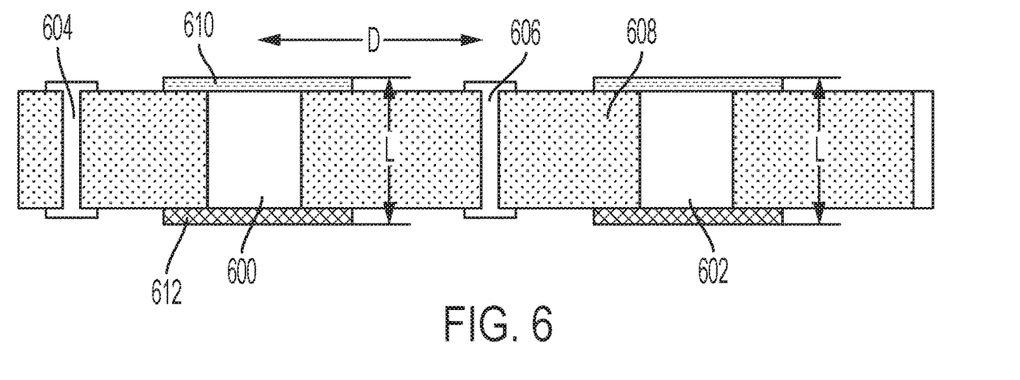
FIG. 6 is a schematic illustration of a cross-sectional view of ground vias and signal vias in a hermetic plate.

FIG. 6 is a schematic illustration of a cross-sectional view of signal vias 600, 602 and ground vias 604, 606 in a hermetic plate 608. The signal vias are designed to help maintain the 50 Ohm transition. According to an embodiment of the invention, the vias are embedded inside the dielectric material forming the hermetic plate 608, and include metallic pads 610, 612 deposited on the surface of the dielectric. The vias have a length L, and are separated by a distance D, where D is measured from the center of one via to the center of another via. The distance D according to an embodiment of the invention is less than $\lambda$. However, the relationship between the distance D and $\lambda$ could be different due to the difference in dielectric constant between exterior waveguides, hermetic dielectric, and interior waveguides. The signal vias 600, 602 may be separated by a ground via 606 that prevents crosstalk between adjacent signal vias. This enables a small pitch and low crosstalk. For example, according to an embodiment of the invention, cross-talk between waveguide channels is less than −50 dB. Further, impedance may deviate only a few percent from 50 Ohm. According to an embodiment of the invention, the vias are designed to be impedance-matched to the interior and exterior electromagnetic waveguides. The vias include a material with low resistance, for example, copper.

Figure 7:
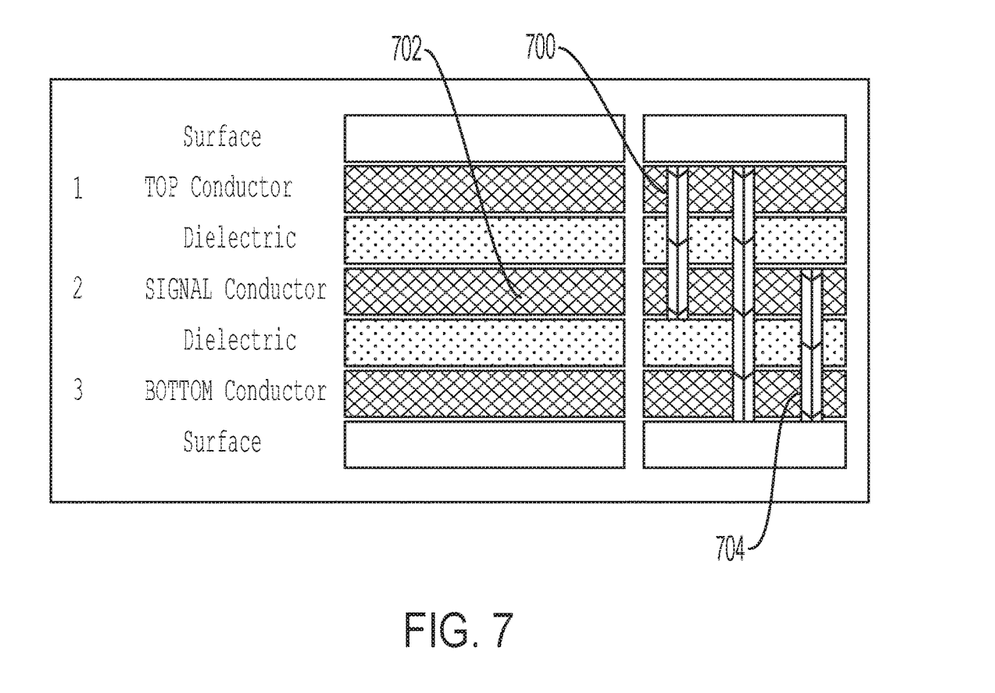
FIG. 7 is a schematic illustration of cross-sectional view of a hermetic plate according to an embodiment of the invention.
Figure 8:
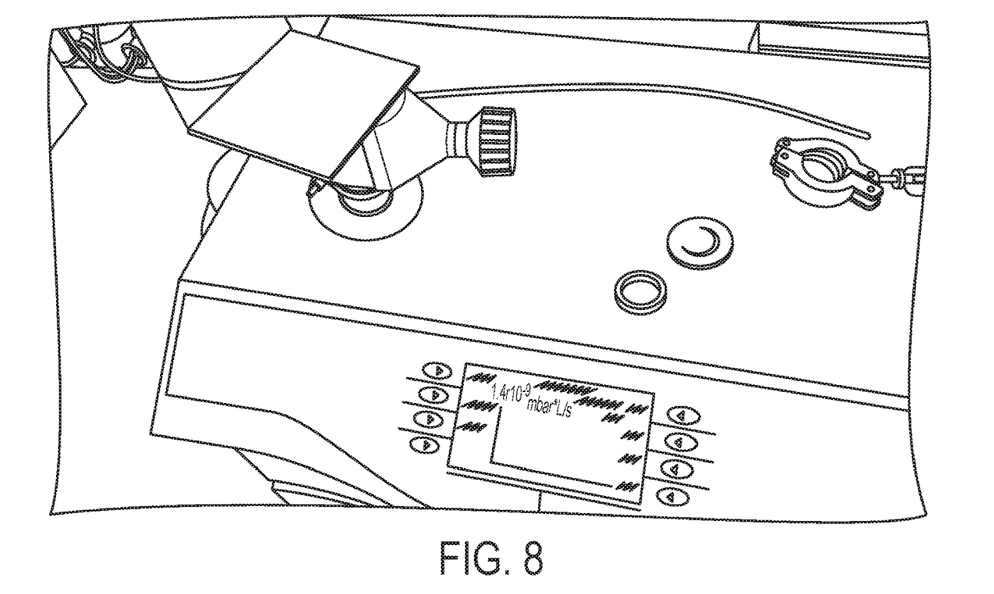
FIG. 8 shows a leak rate of FR-4.

FIG. 7 is a schematic illustration of cross-sectional view of a hermetic plate according to an embodiment of the invention. The hermetic plate includes a via 700 that takes the signal to a stripline transmission line on the signal conductor plane 702 internal to a multi-layer printed circuit board (PCB), and then out to the other side of the hermetic seal by another via 704. The vias 700 and 704 may not extend all the way through the signal conductor plane 702, as shown in FIG. 7. Each signal via may be surrounded by ground vias, as in FIG. 5. The hermetic plate of FIG. 7 enables the use of high-density commercial off-the-shelf connectors without requiring that the connectors be co-located in the xy-axis, where the z-axis is the direction of microwave propagation across the hermetic seal. This configuration helps with the mechanical connection of the connectors by reducing the constraints on their position. The hermetic plate may be formed from dielectrics used in PCB and organic laminates. The hermetic plate may be formed from FR-4, GX-13, duroid, teflon, ceramics, PTFE, fiberglass, and/or polymers, for example. The leak rate of FR-4, a typical dielectric used in PCBs, has been tested to $<2\times10^{-9}$ mbar*L/s, as shown in FIG. 8. The hermetic plate may also include conducting materials that carry electromagnetic signals between the interior and exterior electromagnetic waveguides.

According to an embodiment of the invention, the exterior multi-waveguide connector is screwed into the dielectric plate. A screw may be used to secure the exterior multi-waveguide connector to the dielectric plate as long as the screw does not go all the way through the dielectric plate, thereby breaking hermeticity. Similarly, the interior multi-waveguide connector could be screwed into the dielectric plate. The exterior and interior multi-waveguide connectors may additionally or alternatively be screwed into the dilution refrigerator as long as the electrical connections between the multi-waveguide connectors and the vias are good. Epoxies can also be used to secure the interior and exterior multi-waveguide connectors to the hermetic plate. Other types of seals can also be made, for example, indium seals, copper seals, conflat seals, or other types of seals that can be used for ultra-high vacuum application.

Figure 9:
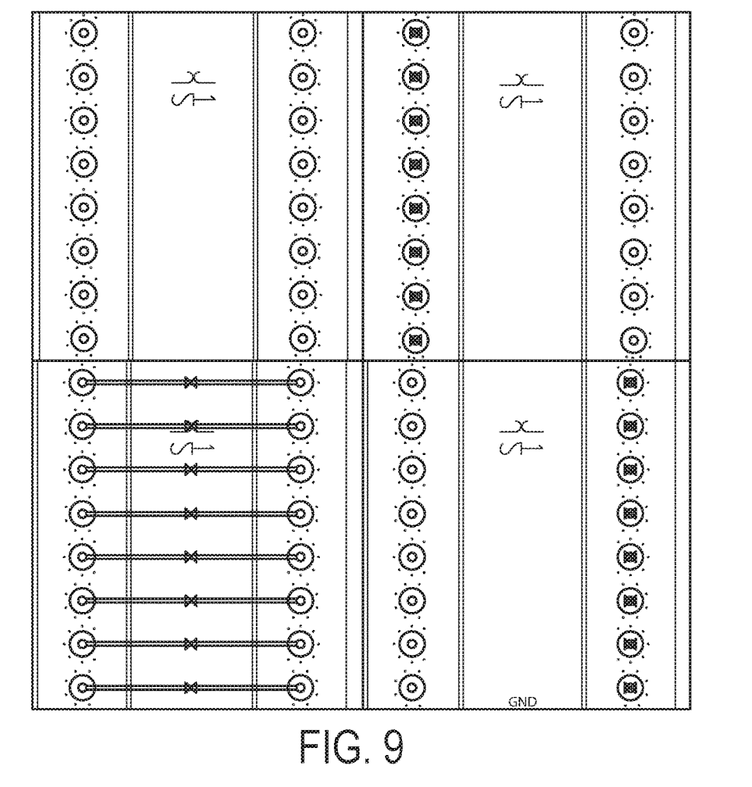
FIG. 9 is a schematic illustration of a hermetic plate that includes a PCB according to an embodiment of the invention.

FIG. 9 is a schematic illustration of a hermetic plate that includes a PCB according to an embodiment of the invention. In the upper left, the exterior connector on the left makes contact with the top of the PCB and the interior connector on the right makes contact with the bottom of the PCB. In the upper right, the top conductor plane of the PCB shows signal vias (such as signal via 700 in FIG. 7) underneath the left exterior connector. In the bottom left, the signal conductor plane (such as signal conductor plane 702 in FIG. 7) shows stripline transmission lines between the exterior and interior connectors. The ground plane between the signal lines shields them from crosstalk. In the lower right, the bottom conductor plane of the PCB shows signal vias (such as signal via 704 in FIG. 7) underneath the right interior connector.

According to an embodiment of the invention, the interior and exterior multi-waveguide connectors have a signal pitch of 0.1 in or 0.05 in, for example. The interior and exterior multi-waveguide connectors can therefore carry 81 signals/sq in and 361/sq. in, for example. Depending on the size of the hole in the plate of the dilution refrigerator into which the hermetic plate is positioned, the hermetic plate may include about 730 signals (for 0.1 in pitch) and 3,200 signals (for 0.05 in pitch) per plate. For a dilution refrigerator with 6 plates, this means approximately 4,400 and 19,500 signals, for example. Without signal multiplexing, 19,500 signal enables control of about 6,500 qubits, assuming one input, one output, and one amplifier pump per qubit. According to an embodiment of the invention, the interior and exterior multi-waveguide connectors are commercial, off the shelf microwave connectors.

Figure 10:
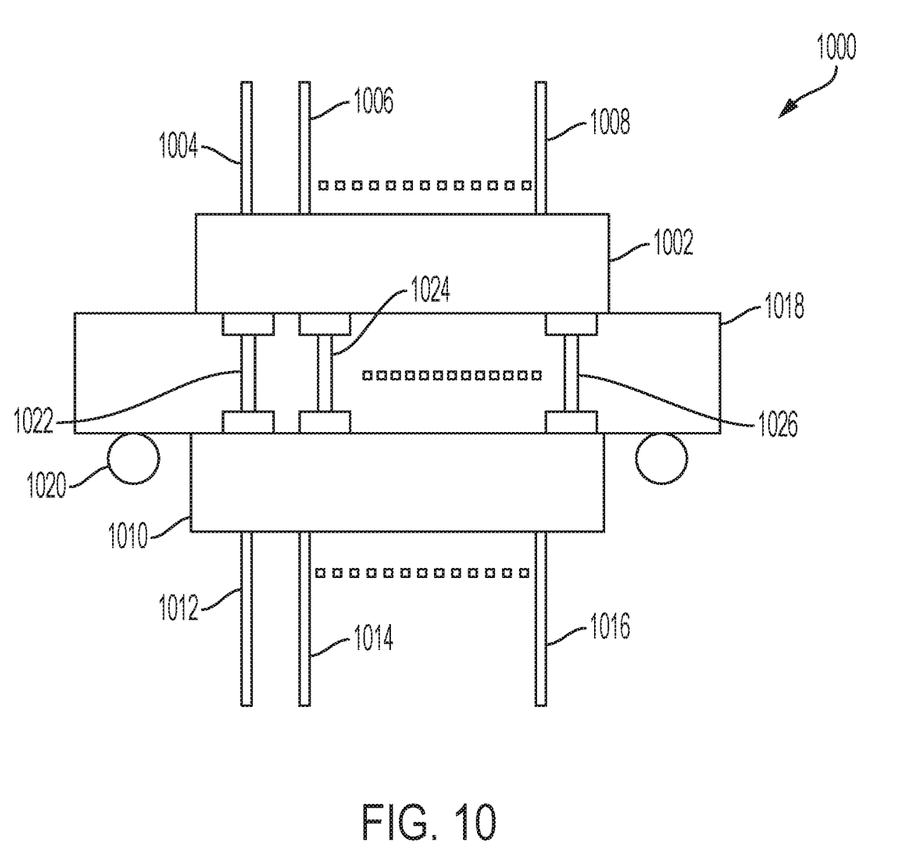
FIG. 10 is a schematic illustration of a hermetic connector assembly according to an aspect of the invention.

FIG. 10 is a schematic illustration of a hermetic connector assembly 1000 according to an aspect of the invention. The hermetic connector assembly 1000 includes an exterior multi-waveguide connector 1002 configured to be connected to a plurality of exterior electromagnetic waveguides 1004, 1006, 1008. The hermetic connector assembly 1000 also includes an interior multi-waveguide connector 1010 configured to be connected to a plurality of interior electromagnetic waveguides 1012, 1014, 1016. The hermetic connector assembly 1000 includes a dielectric plate 1018 arranged between and hermetically sealable with the exterior multi-waveguide connector 1002 and the interior multi-waveguide connector 1010. The dielectric plate 1018 permits electromagnetic energy when carried by the interior pluralities of electromagnetic waveguides 1012, 1014, 1016 and exterior pluralities of electromagnetic waveguides 1004, 1006, 1008 to pass therethrough.

According to an embodiment of the invention, the hermetic connector assembly further includes an o-ring 1020 to be arranged between the dielectric plate 1018 and an outside surface of a containment vessel so as to maintain a refrigerated vacuum environment defined by the containment vessel.

According to an embodiment of the invention, the plurality of interior electromagnetic waveguides 1012, 1014, 1016 is greater than two hundred waveguides and the plurality of exterior electromagnetic waveguides 1004, 1006, 1008 is greater than two hundred waveguides. According to an embodiment of the invention, the plurality of interior electromagnetic waveguides 1012, 1014, 1016 is greater than one thousand waveguides and the plurality of exterior electromagnetic waveguides 1004, 1006, 1008 is greater than one thousand waveguides.

According to an embodiment of the invention, the plurality of interior electromagnetic waveguides 1012, 1014, 1016 and the plurality of exterior electromagnetic waveguides 1004, 1006, 1008 are equal in number and so as to be arranged in a one-to-one correspondence across the dielectric plate to provide waveguide channels.

According to an embodiment of the invention, the dielectric plate 1018 defines vias 1022, 1024, 1026 extending along a direction between each of the plurality of exterior electromagnetic waveguides 1004, 1006, 1008 and the plurality of interior electromagnetic waveguides 1012, 1014, 1016 in the one-to-one correspondence. According to an embodiment of the invention, the vias 1022, 1024, 1026 have a length less than $\lambda/10$, wherein $\lambda$ is a wavelength of electromagnetic waves carried by the plurality of interior and the plurality of exterior electromagnetic waveguides. According to an embodiment of the invention, the vias 1022, 1024, 1026 are separated by distance of less than $\lambda$. According to an embodiment of the invention, cross-talk between waveguide channels is less than −50 dB.

Figure 11:
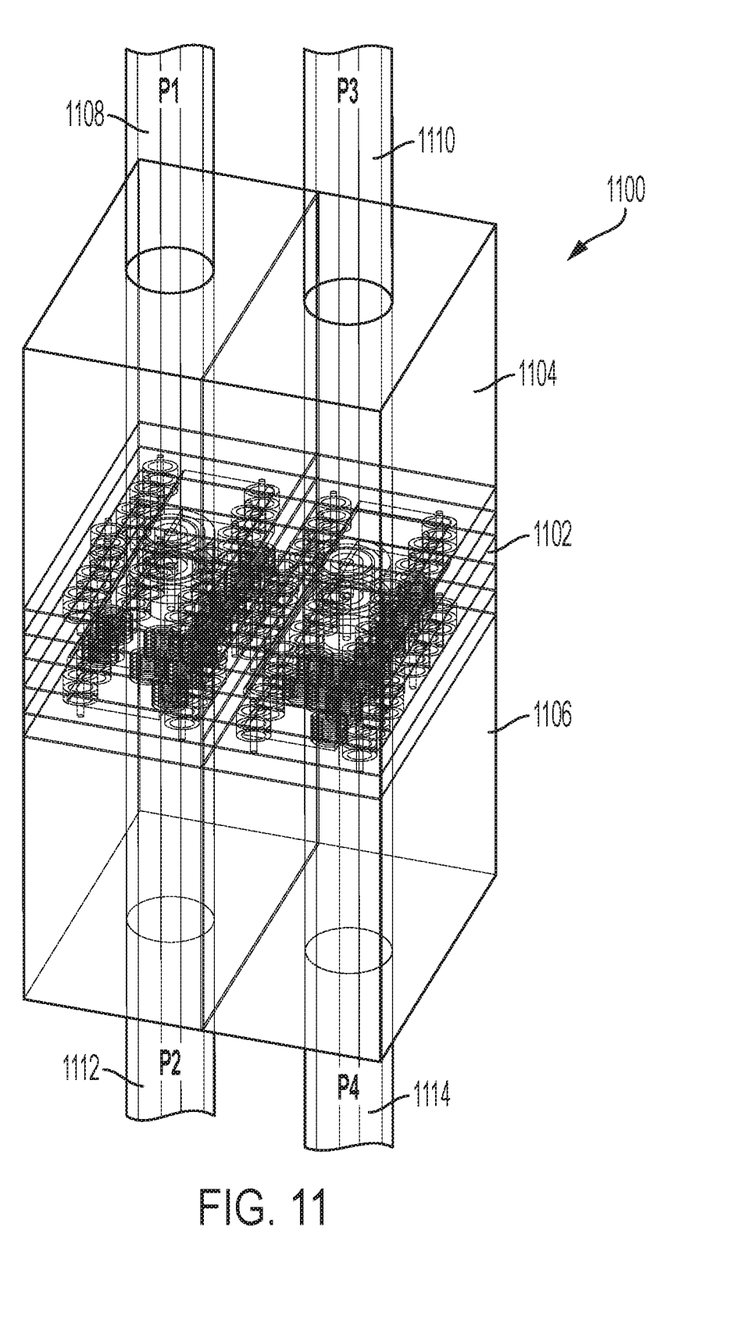
FIG. 11 is a model of a hermetic connector assembly according to an aspect of the invention used for microwave simulation.
Figure 12:
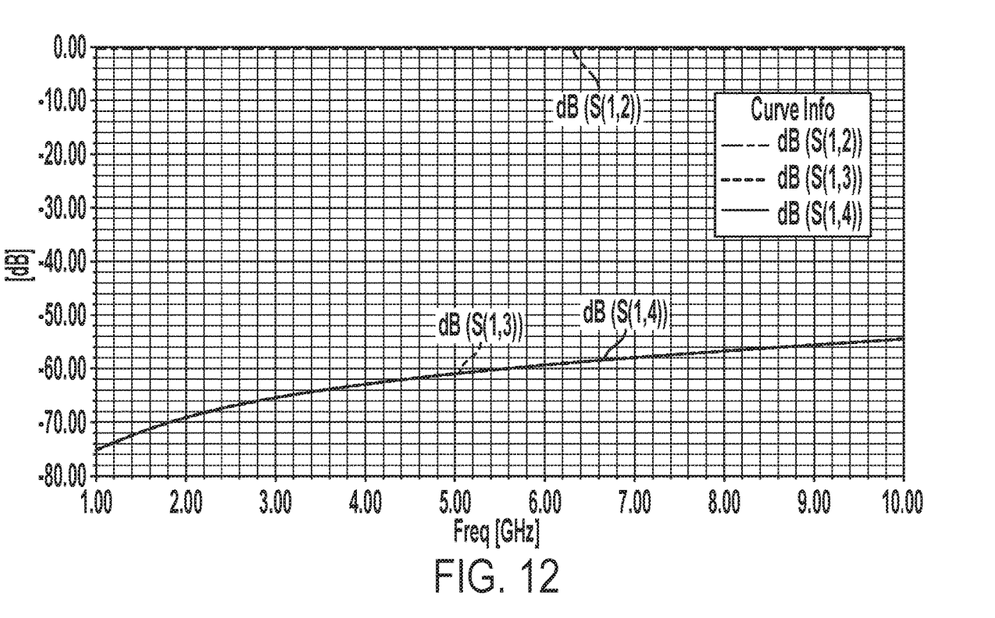
FIG. 12 is a plot showing simulated cross-talk as a function of frequency.
Figure 13:
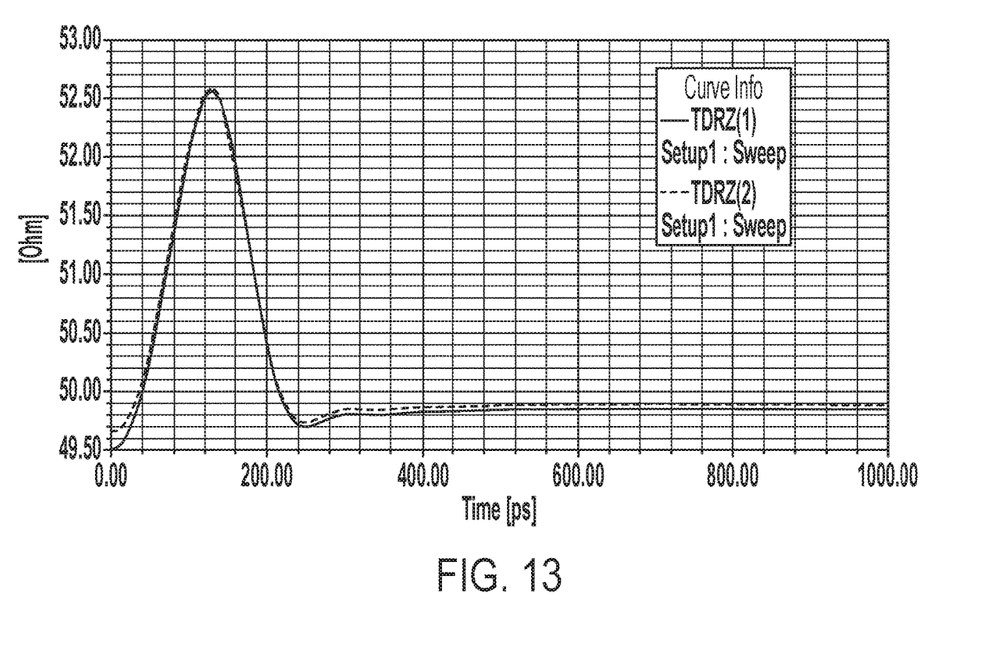
FIG. 13 is a plot showing simulated impedance as a function of time.

FIG. 11 is a model of a hermetic connector assembly 1100 according to an aspect of the invention. The hermetic connector assembly 1100 includes a hermetic plate 1102 including a printed circuit board, an exterior multi-waveguide connector 1104, and an interior multi-waveguide connector 1106. The exterior multi-waveguide connector 1104 is connected to an electromagnetic waveguide 1108 carrying signal P1 and an electromagnetic waveguide 1110 carrying signal P3. The interior multi-waveguide connector 1106 is connected to an electromagnetic waveguide 1112 carrying signal P2 and an electromagnetic waveguide 1114 carrying signal P4. FIG. 12 is a plot showing simulated cross-talk as a function of frequency, where dB(S(1,3)) and dB(S(1,4)) are the cross-talk and dB(S(1,2)) is the transmission. As shown in FIG. 12, cross-talk between waveguide channels is less than −50 dB. FIG. 13 is a plot showing simulated impedance as a function of time. As shown in FIG. 13, impedance is within a few percent of 50 Ohms. The plots in FIG. 12 and FIG. 13 were created using finite element microwave simulation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum computer, comprising:
a refrigeration system under vacuum comprising a containment vessel;
a qubit chip contained within a refrigerated vacuum environment defined by the containment vessel, wherein the qubit chip comprises a plurality of superconducting qubits;
a plurality of interior electromagnetic waveguides arranged within the refrigerated vacuum environment so as to direct electromagnetic energy to and receive electromagnetic energy from at least a selected one of the plurality of superconducting qubits;
a plurality of exterior electromagnetic waveguides arranged exterior to the containment vessel so as to receive electromagnetic energy from and deliver electromagnetic energy to the plurality of interior electromagnetic waveguides; and
a hermetic connector assembly operatively connecting the interior electromagnetic waveguides to the exterior electromagnetic waveguides while maintaining the refrigerated vacuum environment,
wherein the hermetic connector assembly comprises:
an exterior multi-waveguide connector connected to the plurality of exterior electromagnetic waveguides,
an interior multi-waveguide connector connected to the plurality of interior electromagnetic waveguides,
a dielectric plate arranged between and hermetically sealed with the exterior multi-waveguide connector and the interior multi-waveguide connector, wherein the dielectric plate permits electromagnetic energy when carried by the plurality of interior electromagnetic waveguides and the plurality of exterior electromagnetic waveguides to pass therethrough; and
an o-ring arranged between the dielectric plate and an outside surface of the containment vessel so as to maintain the refrigerated vacuum environment defined by the containment vessel.

2. The quantum computer according to claim 1, wherein the plurality of superconducting qubits are a plurality of transmons, and transitions between a ground energy state and a first excited state of each of the plurality of transmons are at microwave energies, and wherein the plurality of interior electromagnetic waveguides and the plurality of exterior electromagnetic waveguides are microwave waveguides.

3. The quantum computer according to claim 2, wherein the microwave waveguides are coaxial cables.

4. The quantum computer according to claim 1, wherein the plurality of interior electromagnetic waveguides is greater than two hundred waveguides and the plurality of exterior electromagnetic waveguides is greater than two hundred waveguides.

5. The quantum computer according to claim 1, wherein the plurality of interior electromagnetic waveguides is greater than one thousand waveguides and the plurality of exterior electromagnetic waveguides is greater than one thousand waveguides.

6. The quantum computer according to claim 1, wherein the plurality of interior electromagnetic waveguides and the plurality of exterior electromagnetic waveguides are equal in number and arranged in a one-to-one correspondence across the dielectric plate to provide waveguide channels.

7. The quantum computer according to claim 6, wherein the dielectric plate defines vias extending along a direction between each of the plurality of exterior electromagnetic waveguides and the plurality of interior electromagnetic waveguides in the one-to-one correspondence.

8. The quantum computer according to claim 7, wherein the vias have a length less than $\lambda/10$,
wherein $\lambda$ is a wavelength of electromagnetic waves carried by the plurality of interior and the plurality of exterior electromagnetic waveguides.

9. The quantum computer according to claim 8, wherein the vias are separated by distance of less than $\lambda$.

10. The quantum computer according to claim 9, wherein cross-talk between waveguide channels is less than −50 dB, and impedance deviates a few percent or less from 50 Ohm.

11. A hermetic connector assembly, comprising:
an exterior multi-waveguide connector configured to be connected to a plurality of exterior electromagnetic waveguides;
an interior multi-waveguide connector configured to be connected to a plurality of interior electromagnetic waveguides;
a dielectric plate arranged between and hermetically sealable with the exterior multi-waveguide connector and the interior multi-waveguide connector, wherein the dielectric plate permits electromagnetic energy when carried by the plurality of interior electromagnetic waveguides and the plurality of exterior electromagnetic waveguides to pass therethrough; and
an o-ring configured to be arranged between the dielectric plate and an outside surface of a containment vessel so as to maintain a refrigerated vacuum environment defined by the containment vessel.

12. The hermetic connector assembly according to claim 11, wherein the plurality of interior electromagnetic waveguides is greater than two hundred waveguides and the plurality of exterior electromagnetic waveguides is greater than two hundred waveguides.

13. The hermetic connector assembly according to claim 12, wherein the plurality of interior electromagnetic waveguides is greater than one thousand waveguides and the plurality of exterior electromagnetic waveguides is greater than one thousand waveguides.

14. The hermetic connector assembly according to claim 11, wherein the plurality of interior electromagnetic waveguides and the plurality of exterior electromagnetic waveguides are equal in number and so as to be arranged in a one-to-one correspondence across the dielectric plate to provide waveguide channels.

15. The hermetic connector assembly according to claim 14, wherein the dielectric plate defines vias extending along a direction between each of the plurality of exterior electromagnetic waveguides and the plurality of interior electromagnetic waveguides in the one-to-one correspondence.

16. The hermetic connector assembly according to claim 15, wherein the vias have a length less than $\lambda/10$,
wherein $\lambda$ is a wavelength of electromagnetic waves carried by the plurality of interior and the plurality of exterior electromagnetic waveguides.

17. The hermetic connector assembly according to claim 16, wherein the vias are separated by distance of less than $\lambda$.

18. The hermetic connector assembly according to claim 17, wherein cross-talk between waveguide channels is less than −50 dB.

19. The hermetic connector assembly according to claim 11, wherein the plurality of interior electromagnetic waveguides and the plurality of exterior electromagnetic waveguides are microwave waveguides.

20. The hermetic connector assembly according to claim 19, wherein the microwave waveguides are coaxial cables.

* * * * *